United States Patent [19]

Shahriary et al.

[11] 4,426,765

[45] Jan. 24, 1984

[54] PROCESS FOR FABRICATION OF OHMIC CONTACTS IN COMPOUND SEMICONDUCTOR DEVICES

[75] Inventors: Iradj Shahriary, Santa Monica; Thomas G. Mills, Carson, both of Calif.

[73] Assignee: TRW Inc., Redondo Beach, Calif.

[21] Appl. No.: 295,924

[22] Filed: Aug. 24, 1981

[51] Int. Cl.³ .................. H01L 21/283; H01L 21/225
[52] U.S. Cl. ..................... 29/571; 29/576 B; 29/591; 148/1.5; 148/187
[58] Field of Search ............. 29/571, 576 B, 591; 148/187, 1.5; 357/65

[56] References Cited

U.S. PATENT DOCUMENTS

| | | | |
|---|---|---|---|
| 4,173,063 | 11/1979 | Kniepkamp et al. | 29/576 B |
| 4,244,097 | 1/1981 | Cleary | 29/576 B |
| 4,267,014 | 5/1981 | Davey et al. | 148/1.5 |
| 4,297,782 | 11/1981 | Ito | 29/576 B |
| 4,298,403 | 11/1981 | Davey et al. | 148/1.5 |
| 4,301,188 | 11/1981 | Niehaus | 29/571 X |
| 4,325,181 | 4/1982 | Yoder | 29/571 |
| 4,330,343 | 5/1982 | Christou et al. | 148/187 X |
| 4,377,030 | 3/1983 | Pettenpaul et al. | 148/187 X |

*Primary Examiner*—G. Ozaki
*Attorney, Agent, or Firm*—Noel F. Heal; Robert W. Keller; Donald R. Nyhagen

[57] ABSTRACT

A process and related product in which ohmic contacts are formed in semiconductor devices employing compound substrates such as gallium arsenide. In the disclosed embodiment, a germanium layer (18) is deposited in those areas (14) in which ohmic contact is required and is subsequently diffused into a layer 20 of the substrate during a conventional annealing step required to relieve damage caused to the substrate during a prior conventional ion implantation step. As a result of the diffusion of the germanium, good ohmic contact can be made by deposition of a conductive metal 26, such as gold. Thus, a common metalization step can be employed to form both the ohmic contact regions and rectifying contact regions used as gates in field effect transistors.

8 Claims, 7 Drawing Figures

PROCESS FOR FABRICATION OF OHMIC CONTACTS IN COMPOUND SEMICONDUCTOR DEVICES

BACKGROUND OF THE INVENTION

This invention relates generally to semiconductor fabrication techniques and, more particularly, to processes for fabricating low contact resistance ohmic contacts in semiconductors utilizing a compound semiconductor substrate, such as gallium arsenide (GaAs).

Field effect transistors commonly referred to as FETs, are very often fabricated on a substrate of a compound semi-conductor, material, such as gallium arsenide. For example, metal semiconductor field effect transistors (MESFETs) can be fabricated on a gallium arsenide substrate. In one manufacturing process, the substrate is implanted with silicon ions to form an n-type layer along one surface of the substrate. When a conducting metal, such as gold, is deposited on the n-type layer, a rectifying junction is formed, i.e., one which has a desired non-linear relationship between voltage and current. For the formation of a basic field effect transistor, one rectifying contact is required, usually referred to as the gate terminal, and two nonrectifying or ohmic contacts must be made with other regions of the n-type layer. In the past, the ohmic contacts have been made by means of an alloy of gold and germanium, which is deposited on the ohmic contact areas and then heated to a prescribed temperature for a prescribed time. The alloy penetrates the n-type layer and makes relatively good ohmic contact. However, these steps of forming the ohmic contact are inconsistent with the other processing steps in the typical MESFET manufacturing process, which may be employed to manufacture large numbers of MESFET transistors on a single substrate. Moreover, alloy contacts have a tendency to fail after a period of years, especially under high-temperature conditions.

It will be appreciated, therefore, that there has been a significant need for a process for fabricating ohmic contacts on such devices, wherein the steps of the process are not inconsistent with the fabrication steps for the device as a whole. The present invention fulfills this need.

SUMMARY OF THE INVENTION

The present invention resides in a process and products made thereby, wherein a thin layer of material is first selectively deposited on a compound substrate, and an ion implantation step is effected through the deposited layer on the substrate. Then, in a conventional step of damage annealing the device to relieve ion implantation damage, the deposited material is diffused into the ion-implanted substrate to form a highly effective ohmic contact. Finally, when metal is deposited on the device, an ohmic contact is formed at the regions where the thin layer of material was diffused into the ion-implanted substrate, and a conventional rectifying contact is formed in those regions where there was no diffusion of the deposited material. Thus, a common metalization step can be employed to form both ohmic contacts and rectifying contacts in the device.

With respect to the process of the invention as it pertains to the fabrication of gallium arsenide MESFET devices, the thin layer of deposited material is germanium. During the ion implantation step, the germanium remains in place and ions are transmitted through it to form the n-type layer in the germanium arsenide substrate. During the annealing step, the germanium diffuses into the n-type layer and forms the ohmic contact. Subsequently, when a metal such as gold is deposited on the n-type layer into which the germanium has been diffused, a practically perfect ohmic contact is made with the n-type layer.

More specifically, the steps of the process are first depositing a layer of silicon nitride ($Si_3N_4$) onto the gallium arsenide substrate, then using a conventional photo-resist process to open windows in the silicon nitride layer at regions corresponding to the desired regions of ohmic contact. In the photo-resist process, a photo-resist layer is applied over the silicon nitride layer, then photographically exposed to an image of an ohmic contact mask which defines the ohmic contact areas. Subsequently the regions of the photo-resist layer corresponding to the ohmic contact regions can be etched away, together with the underlying portions of the silicon nitride layer, thereby exposing the substrate only in the ohmic contact regions.

The next and most critical step in the process of the invention is to evaporate germanium and thereby deposit it on the exposed window areas by means of a conventional photo-resist and lift technique. Next, using an isolation mask which defines those areas of the substrate to be implanted with silicon ions, the substrate structure is bombarded with silicon ions, which penetrate both through the germanium layer and through the silicon nitride layer in other areas of the device. Then the entire device is covered by a deposited layer of silicon dioxide ($SiO_2$) and annealed at a temperature of 850° C. The annealing step is conventional in the MESFET manufacturing process and is commonly referred to as a damage annealing step. The annealing step in accordance with the invention, however, has the additional important function of diffusing the germanium into the substrate in the ohmic contact regions. After the annealing step, the silicon dioxide layer and any excess germanium are removed by etching and additional windows are opened in the silicon nitride layer to define the gate regions of the device, i.e., those regions in which a rectifying contact is to be made with the n-type layer formed by ion implantation into the substrate. Finally, a common ohmic and rectifying metal is deposited onto the device, forming ohmic contact in the desired ohmic contact regions and rectifying contact in the exposed gate regions.

It will be appreciated from the foregoing that the present invention provides a significant advance in the field of semiconductor fabrication. In particular, it provides a technique for producing high quality ohmic contacts without the use of an alloy. The new process, therefore, avoids the disadvantages inherent in the use of metalized alloy contacts. Moreover, the invention provides reliable ohmic contacts for semiconductor devices of this type without departing significantly from the conventional fabrication steps used in the manufacture of the device, and permits use of a common metalization step to establish both ohmic and rectifying contacts with the device. Other aspects and advantages of the invention will become apparent from the following more detailed description, taken in conjunction with the accompanying drawings.

DESCRIPTION OF THE PREFERRED EMBODIMENT

Figure 1A:
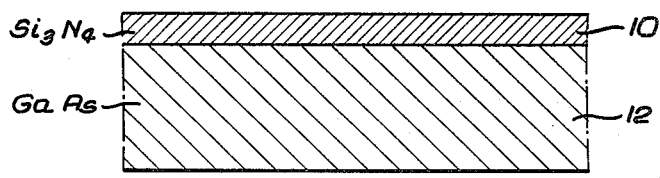
FIGS. 1a–1g depict the processing steps used in applying the invention to the manufacture of gallium arsenide (GaAs) MESFET devices.

As shown in the drawings for purposes of illustration, the present invention is concerned with a significant improvement relating to the formation of ohmic contacts in the manufacture of compound semiconductor devices. In the past, such ohmic contacts have typically been formed by means of an alloy of two metals, which is diffused to some degree into the semiconductor material during a heating step. The time and temperature of the heating step have to be carefully controlled, and unfortunately the step is in no way related to other fabrication steps needed to make the device.

In accordance with the present invention, ohmic contacts are formed during the course of fabrication of the device, and without departing from the normal processing steps except in one important respect. In the conventional process for fabricating field effect transistors on compound semiconductor substrates, there is an ion implantation step during which ions, typically silicon ions, are implanted in the substrate to form an n type layer, and there is a subsequent annealing step, usually referred to as damage annealing, during which damage to the ion implanted layer is relieved by heating. In accordance with the invention, prior to the ion implantation step, an additional layer is deposited on those regions in which ohmic contact is required. In the illustrative embodiment of the invention, the layer is of germanium. Then, the ions implanted through the germanium layer create crystalline damage to the semiconductor substrate so as to enhance diffusion of the germanium during the subsequent annealing step. Hence, in the subsequent annealing step the germanium is diffused into the n-type layer, to form a highly doped n-type layer. Subsequently, a common metalization step may be employed to deposit metal over the ohmic contact regions and over subsequently exposed gate regions at which rectifying contact is desired.

Figure 1B:
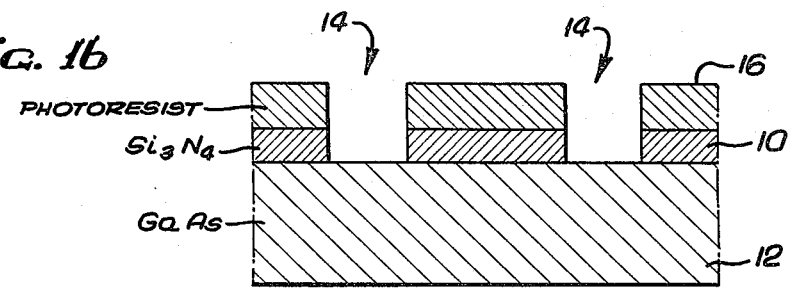

More specifically, and with reference to the drawings, the first step of the manufacturing process is the deposition of a silicon nitride ($Si_3N_4$) layer, referred to by reference numeral 10, over a substrate 12, which in the illustrative embodiment is of gallium arsenide (GaAs). A cross section of the device after this first step is shown in FIG. 1a. Next, as shown in FIG. 1b, windows 14 are formed in the silicon nitride layer 10 at regions where ohmic contacts are desired to be made. This is done by using an ohmic contact mask (not shown), which defines the desired areas of ohmic contact, in conjunction with a conventional photo-resist process. In the photo-resist process, a photo-resist layer 16 is deposited over the silicon nitride layer 10 and is selectively exposed through the ohmic contact mask. Then, in an etching step, portions 14 of the photo-resist layer 16 and the silicon nitride layer 10 are removed at those regions corresponding to the desired ohmic contact regions.

Figure 1C:
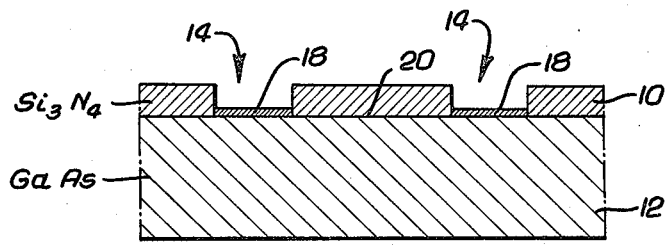
Figure 1D:
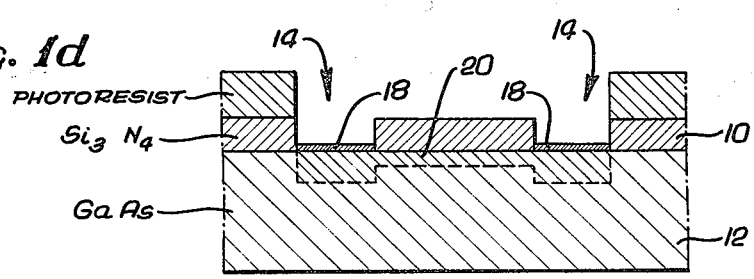
Figure 1E:
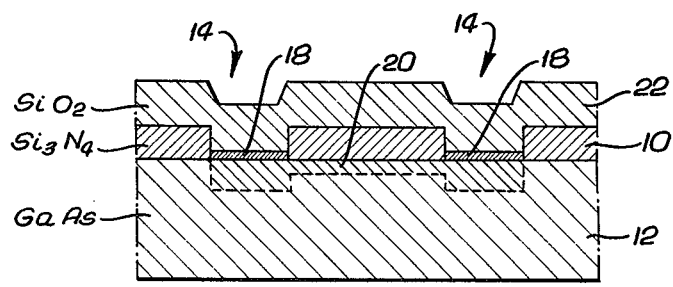

In the next step, as shown in FIG. 1(c), a layer of germanium 18 is evaporated onto the window regions 14 corresponding to the ohmic contact areas, as defined by a conventional photo resist and lift technique. The germanium layer must be thin, on the order of 1/5 of the thickness of the silicon nitride layer 10, and in particular is about 200 to 300Å. Next as shown in FIG. 1(d), an isolation mask (not shown) is used to selectively implant ions, typically silicon ions, through both the germanium 18 and the silicon nitride layer 10 selectively exposed during another conventional photo resist step. This results in the formation of an n-type layer 20 in the upper region of the substrate 12. It will be seen that the ions have penetrated more deeply in the ohmic contact areas 14 than in the areas surmounted by the silicon nitride layer 10. As shown in FIG. 1e, the entire device, including the silicon nitride layer 10 and remaining germanium layer 18 are covered with a protective coating 22 of silicon dioxide ($SiO_2$) before an annealing step at a temperature of approximately 850 degrees Centigrade. During this damage annealing step, damage done during the ion implantation step is relieved but, more importantly, in accordance with this invention the germanium 18 is diffused into the n-type layer 20 to form a good ohmic contact therewith.

Figure 1F:
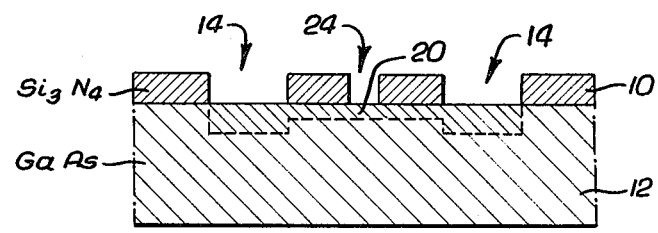
Figure 1G:
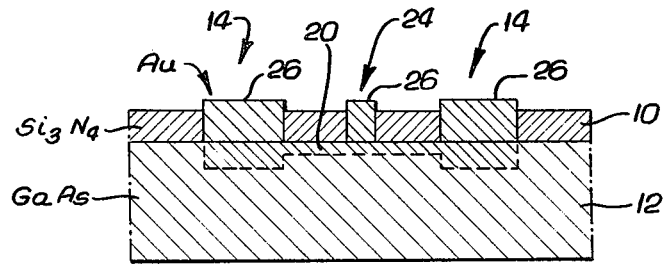

As shown in FIG. 1f, the silicon dioxide layer 22 is next removed by etching, together with any excess germanium remaining after the annealing and diffusion step. In addition, other window regions, such as the one shown at 24, are opened in the silicon nitride layer 10 at positions where rectifying junctions are required. These are the gate regions of the field effect transistors in the device. Finally, there is a single step of deposition of rectifying metal, such as gold 26, the step being made both to form the ohmic contacts in the desired regions 14, and to form the rectifying gate regions, such as 24. No metal alloy need be used at this point and a more reliable ohmic contact is obtained than by means of alloy processes. In fact, the removal of excess germanium prevents any alloying from occurring during subsequent metalization or other processing steps. Such alloys would adversely lower the temperature range of operation of devices formed in accordance with this invention, and hence decrease the reliability of such devices.

It will be appreciated from the foregoing that the present invention represents a significant advance in the field of semiconductor fabrication. In particular, it provides a more reliable technique for the formation of ohmic contacts in compound semiconductor devices fabricated by integrated-circuit techniques. It also allows for a common metalization step for the formation of both ohmic contacts and rectifying contacts. Although a particular fabrication process has been described in detail for purposes of illustration, it will be appreciated that the invention also has application to other fabrication processes using compound semiconductors as substrates and different materials as the diffused material forming the ohmic contact with the substrate. Other modifications may also be made without departing from the spirit and scope of the invention. Accordingly, the invention is not to be limited except as by the appended claims.

We claim:

1. A method of fabricating ohmic contacts in a semiconductor device having a compound semiconductor substrate, said method comprising the steps of:

selectively depositing a thin layer of material on the substrate;

implanting ions in the substrate through the deposited layer, said implanting step being a normal step in a field-effect transistor (FET) fabrication process;

annealing the entire device to relieve ion implantation damage, said annealing step being a normal step in the FET fabrication process;

diffusing the material in the thin layer into the ion-implanted substrate, to form ohmic contact regions as a result of said annealing step; and depositing metal on the ohmic contact regions, said depositing step being the normal metalization step used to form non-ohmic contacts in the FET fabrication process;

whereby said method of forming ohmic contacts is integrated into the normal FET fabrication process by the inclusion of only said selectively depositing step.

2. A method as set forth in claim 1, wherein:
the substrate material is gallium arsenide; and
the material deposited in said step of selectively depositing and diffused in said step of diffusing is germanium.

3. A method as set forth in claim 1 wherein said step of depositing metal simultaneously forms ohmic contacts in the selected ohmic contact regions and rectifying contacts in selected gate regions.

4. A method of making ohmic contacts in a gallium arsenide field effect transistor device, said method comprising the steps of:
forming a first layer on a gallium arsenide substrate;
opening window regions in the first layer at selected areas at which ohmic contact is to be established;
depositing a germanium layer on the substrate in the window regions;
implanting ions in the substrate over selected areas that include the window regions;
annealing the device to relieve ion implantation damage in the substrate;
diffusing germanium into the ion-implanted substrate as a result of said annealing step;
removing any excess germanium remaining on the substrate surface; and
depositing metal over the window regions to form ohmic contacts;
whereby said steps of opening window regions, implanting ions, and annealing are normal field effect transistor fabrication steps, and said diffusing and removing steps result from said annealing step.

5. A method as set forth in claim 4, and further including the steps of:
forming additional window regions in said first layer prior to said step of depositing metal, the additional window regions corresponding to selected gate regions at which rectifying contact is required with the substrate; and depositing metal on the additional window regions at the same time that metal is deposited to form the ohmic contacts, whereby only a single common metalization step is employed.

6. A method as set forth in claim 4, wherein:
said step of depositing germanium is effected by evaporation.

7. A method as set forth in claim 4, wherein:
said step of annealing is preceded by a step of depositing a protective layer of silicon dioxide over the entire device; and
said step of annealing is followed by a step of removing the protective layer.

8. A method of fabricating a metalsemiconductor, field effect transistor device having a gallium arsenide substrate, said method comprising the steps of:
depositing a layer of silicon nitride on the substrate;
opening window regions in the silicon nitride using a photo-resist process, the window regions defining areas at which ohmic contact is to be made;
depositing a thin layer of germanium on the substrate in the window regions;
implanting silicon ions in the substrate through the germanium layer and selected areas of the silicon nitride layer, to form an n-type region in the substrate;
forming a silicon dioxide layer over the device;
annealing the device to relieve ion implantation damage;
diffusing germanium from the deposited layer into the n-type substrate region during said annealing step;
removing the silicon dioxide layer and any excess germanium;
forming additional window regions in the silicon nitride layer, at gate areas where rectifying contact with the n-type region is required; and
depositing gold over all of the window regions, to form ohmic contacts in the desired regions and rectifying contacts in the desired regions;
whereby, except for said step of depositing germanium, all of the steps are conventional field effect transistor fabrication steps, or take place as a direct result of such a conventional step.

* * * * *